United States Patent [19]

Bui

[11] Patent Number: 4,947,362
[45] Date of Patent: Aug. 7, 1990

[54] DIGITAL FILTER EMPLOYING PARALLEL PROCESSING

[75] Inventor: Tuan H. Bui, Piscataway, N.J.

[73] Assignee: Harris Semiconductor Patents, Inc., Melbourne, Fla.

[21] Appl. No.: 187,869

[22] Filed: Apr. 29, 1988

[51] Int. Cl.[5] ............................................. G06F 15/31
[52] U.S. Cl. ................................................ 364/724.19
[58] Field of Search ....................... 364/724.16, 724.19, 364/724.20, 724.13

[56] References Cited

U.S. PATENT DOCUMENTS

| 3,665,171 | 5/1972 | Morrow ......................... | 364/724.13 |
| 4,038,536 | 7/1977 | Feintuch ........................ | 364/724.19 |
| 4,754,419 | 6/1988 | Iwata .............................. | 364/724.19 |

OTHER PUBLICATIONS

B. Widrow et al., "Adaptive Signal Processing", Prentice-Hall, Inc. Englewood Cliffs, N.J. 07632, 1985, pp. 98–116.

B. Ahuja et al., "A Sampled Analog MOS LSI Adaptive Filter", IEEE Trans. on Communications, vol. COM-27, No. 2, Feb. 1979, pp. 406–412.

Primary Examiner—Gary V. Harkcom
Assistant Examiner—Long T. Nguyen
Attorney, Agent, or Firm—Henry I. Schanzer

[57] ABSTRACT

An adaptive digital filter can be implemented on a single Very Large Scale Integrated (VLSI) circuit silicon chip and the Least Mean Square adaptive filter algorithm can be performed by parallel processing during a single clock cycle. The adaptive filter contains dual delay lines to yield a sequence of simultaneous samples of both input and output signals. Correlations of the present error difference with previous samples of both input and output signals can then take place simultaneously in each clock cycle. The adaptive filter is modular and can be cascaded with other identical filters to form a high-order filter.

25 Claims, 4 Drawing Sheets

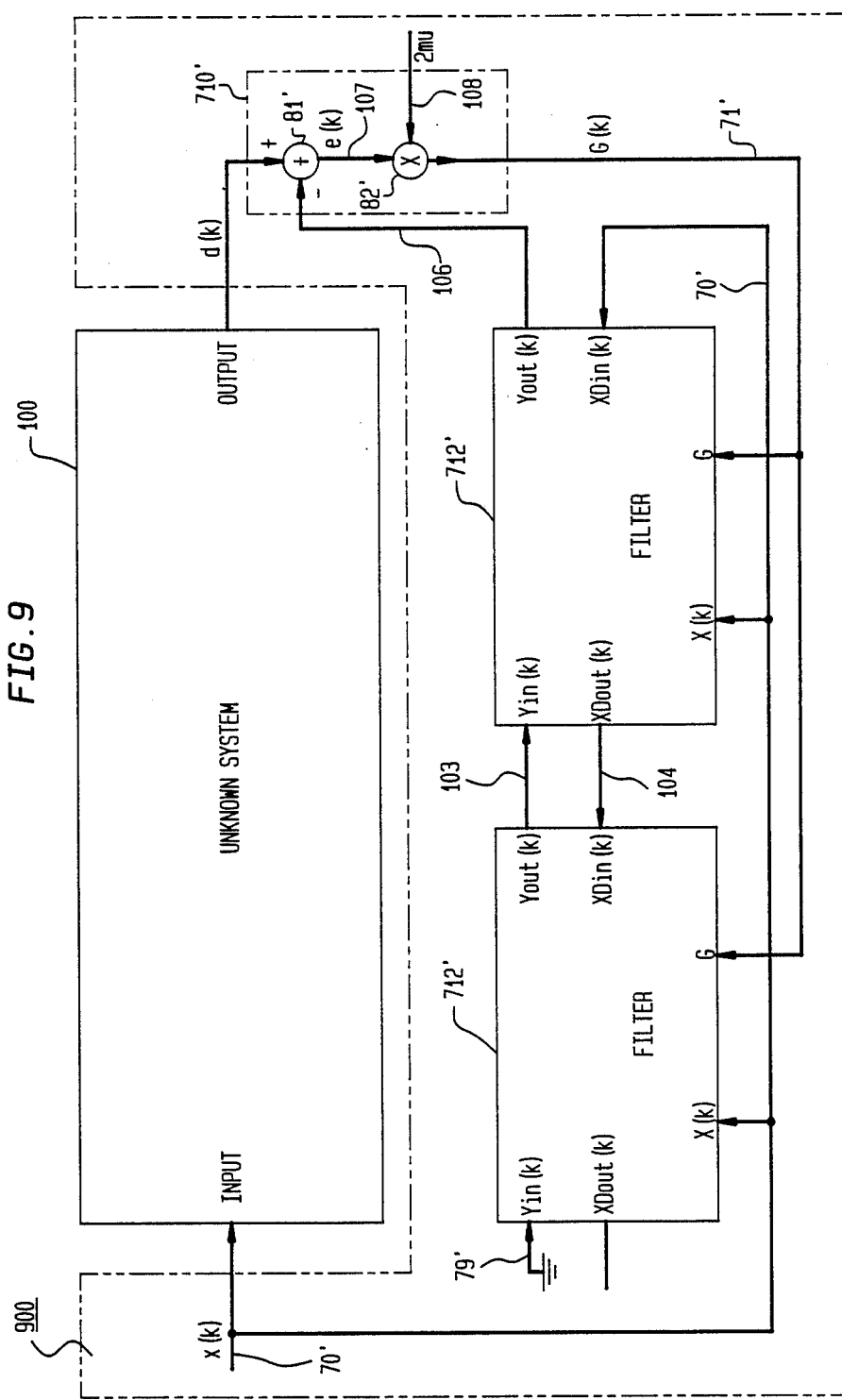

DIGITAL FILTER EMPLOYING PARALLEL PROCESSING

FIELD OF THE INVENTION

This invention relates to the processing of information in the form of electrical signals and, in particular, to adaptive signal processing. More specifically, this invention covers implementation of the least mean square (LMS) adaptive filter algorithm by means of parallel processing, as distinguished from serial or sequential processing.

BACKGROUND OF THE INVENTION

Adaptive signal processing is a powerful technique and is often the only technique available when the signals being processed are not deterministic, i.e., not predictable from precise cause and effect. Ohm's Law, for example, is deterministic. Adaptive signals are signals that are alterable or adjustable in accordance with their environment. The automatic gain control (AGC) used in radio and television receivers adjusts sensitivity inversely as the average incoming signal strength. Thus, a wide range of input signal levels is translated into a narrower range of output intensities.

Essential properties of truly adaptive systems are their time-varying, self-adjusting and nonlinear attributes. When the complete range of input conditions for a given system is known, then a design can be fixed and no provision for adaptation is necessary. Examples are low-pass, band-pass and high-pass filters. However, many real-life systems involve parameters whose input conditions vary randomly with time. Examples of closed-loop nonlinear systems that benefit from adaptive adjustment include signal coding, noise reduction, transmission channel equalization, echo or interference cancellation in long transmission channels, speech recognition, image processing and inverse signal modelling.

The manner in which an adaptive filter adjusts itself is described by an adaptive algorithm. An algorithm is a step-by-step procedure for solving a problem (usually mathematical in nature). Many algorithms for performing adaptive filtering exist and each satisfies different performance criteria. Examples are minimization of the total error, i.e., sum squared error, and maximum likelihood optimization. Popular adaptive algorithms are the least mean square (LMS) and the least square (LS) types.

The LMS algorithm is often the algorithm of choice for hardware realization because it solves adaptive filter problems without prior knowledge of higher order statistics of the signal being processed. The LMS algorithm is derived in Chapter 6 of the book entitled "Adaptive Signal Processing", by B. Widrow and S. D. Stearns, Prentice-Hall, Inc., 1985.

There are several known applications of the LMS algorithm in both analog and digital form which use so-called transversal filters. A transversal filter is a time-domain network in which time-spaced samples of a given input signal are plurally weighted and summed to produce as an output signal an idealized replica of the input signal. These applications, however, have invariably used sequential processing or microprocessor control.

FIGS. 1 through 4 illustrate four examples of adaptive filters of the transversal type. In this type of filter the output signal is compared with a desired signal to generate a performance error which is fed back to adjust the characteristics of the filter to achieve more nearly optimal performance. The error symbol at adaptive processor blocks 15 connotes adjustability.

FIG. 1 shows an adaptive filter used as a linear predictor. In this application the adaptive filter 15 is required to predict, on the basis of past sample values of input signal (s) on line 10, a future value of (s). The desired signal in this case is the value of (s) that the filter is trying to predict and the output signal (y) on line 20 is the actual value that the filter obtained through application of the algorithm. An error signal (e) on line 19 is then the prediction error formed in subtracter circuit 12 from the difference between the value (y) in the output of adaptive processor 15 (also appearing on line 20) and input signal (s) provided on line 11. Signal (s) is delayed in delay unit (13) before being applied to processor 15 to allow for processing time. Error signal (e) is a performance indicator which is fed back to processor 15 by way of line 19 to implement the adaptation algorithm. The smaller the value of (e), the better is the prediction performance of the filter. Linear prediction is particularly useful in speech encoding and data compression.

FIG. 2 is configured as a system for system identification. The adaptive filter 15 is here used to identify the impulse response of unknown system 16. Effectively, a finite impulse response (FIR) filter of order M, i.e., having M sampling stages, is used to model the unknown system. The adaptive processor is being adjusted to replicate the impulse response of the unknown system 16. Input signal (s) on line 10 is applied to both unknown system 16 and to adaptive processor 15. The respective outputs (d) and (y) (also appearing on output line 20) of blocks 16 and 15 are combined in subtracter 12 to form error signal (e) on line 19 for control of the processor 15. It is apparent that when error signal (e) becomes zero, the output of unknown system is completely identified. Thus, an echo canceller has been implemented. Input signal (s) can be a speech signal distorted by echoes and error signal (e) can be the desired error-free speech output of the system.

FIG. 3 illustrates the application of the adaptive filter 15 to signal equalization. Input signal (s) on line 10 is assumed to have been altered in traversing a distorting transmission channel (not shown), which also contributes additive noise. In addition to the noise inherent to the unknown system 16, further noise is explicitly introduced on line 23 through combiner 22, which is connected in series between unknown system 16 and adaptive processor 15. The introduced noise is random noise which normally exists when the unknown system communicates with some other system. The added noise helps in masking the inherent noise by correlating with it. The filter needs to find a response that is the inverse of the distortion and noise contributed by the transmission channel. A desired output signal (y) on line 20 is the uncontaminated information signal itself. Input signal (s) is here actually a training signal known to both sides of the transmission channel. Adaptive processor 15 is controlled by error signal (e), which is generated in subtracter 12 and coupled to line 19. Error signal (e) results from taking the difference between input signal (s), after it is delayed in delay unit 13 as signal (d) and a system output signal (y) from processor 15. Adaptive processor 15 adapts during the application of input signal (s), learns the channel characteristics, provides the inverse of the channel distortions, and allows the true information signal to pass through the system to output line 20.

FIG. 4 is an implementation of an adaptive filter to the problem of interference cancellation, such as is present in anti-jamming countermeasures techniques for radar detection systems. A jamming signal (n), friendly or not, is assumed to be overpowering a desired signal (s) on line 10 to such a degree that signal (s) cannot be recognized. The actual signal (s+n) shown on line 10 is a combination of (s) and (n). A second local noise signal (n') is provided as a reference and is assumed to be correlated with the jamming signal (n) to a certain degree. Adaptive processor 15, to which noise (n') is applied by way of line 10, acts to cancel the correlated parts of signals (n) and (n') and replicates as nearly as is feasible signal (s), now assumed to be uncorrelated with either noise signal. The jammed input signal (s+n) has been combined, as shown, in subtracter 12 with an output signal (y) of processor 15 to form error control signal (e) on line 19 for application to processor 15. Signal (y) is then the estimated value of jamming noise signal (n), and error signal (e) is the desired jammed signal (s).

From the foregoing examples, the basic elements of an adaptive system can be recognized:

A signal to be processed;

A desired signal to be emulated; and

An adaptive structure and its implementing algorithm.

FIG. 5 is a block schematic diagram of a known Finite Impulse Response (FIR) digital filter 500 of the sixth order, i.e., capable of providing a total of six samples of an input signal. Five unit delay units 51, each having a unit delay ($z^{-1}$), are shown in series with an input signal x(k) on input line 50. Beginning at the input and at each junction or tap between delay units 51 there is connected an adjustable multiplier 52 implementing a weighting factor ($w_i$) The convoluted sum of the present sample and five delayed input samples taken in a multi-input adder 53 forms the shaped output signal y(k) on output line 55 of the filter. The output signal y(k) is defined as:

$$y(k) = \sum_{i=0}^{m-1} w_i \, x(k - i);$$

where (m) is the order of the FIR filter and ($w_i$) are the individual tap or junction weights. The tap weights are either preset according to calculation based on a desired shape or are set according to an LMS algorithm designed to minimize the mean square error adaptively.

FIG. 6 is a block schematic diagram of a known type of digital adaptive filter 600 in third-order form. Adaptive filter 600 has a number of components which are very similar or essentially identical to the filter 500 of FIG. 5 or which have the same reference number with a prime (') added thereafter. Other than the fact that filter 600 is a third-order filter as compared to the filter 500 of FIG. 5, which is a sixth-order filter, the difference between the two is that the gain-control factors of multipliers 52' are automatically set to proper values by the combination of subtracter 67, multipliers 68 and 64 and combiners 63. Each combiner 63 is typically a two-input adder with memory. A feedback path between a first input of each combiner 63 and the output thereof serves to cause combiner 63 to provide at the output thereof a signal which is the sum of the signal applied to the second input and the previous stored signal. Adaptive filter 600 is denoted as such because it generates an error signal e(k) at the output of combiner 67, which effectively and automatically adjusts the gain settings of multipliers 52'.

Line 50' is coupled to the first delay unit 51', to a first input of the first multiplier 52' and to a first input of the first multiplier 64. An output of each of the multipliers 52' is coupled to multi-input adder 53''. An output of each of combiners 63 is coupled to a second input of a separate multiplier 52' and to a first input of a separate one of combiners 63. An output of each of multipliers 64 is coupled to a second input of a separate one of combiners 63. A desired signal d(k) is applied to the plus (+) input of combiner 67 and the output signal y(k) of multi-input adder 53' is applied by way of line 55 ' to the minus (−) input of combiner 67. An output of combiner 67 is coupled to second inputs of all of the multipliers 64. Optionally, (as shown by the dashed lines) the error signal e(k) is further adjusted by a gain factor, such as is shown as 2 mu, at combiner 68, whose output is applied to multipliers 64 by way of a dashed line 66.

Adjustable multipliers 52' are controlled by combiners 63 and multipliers 64. Sampled and weighted signals in outputs of multipliers 52' are accumulated in multi-input adder 53'', as the corresponding signals at the outputs of multipliers 52 are accumulated in multi-input adder 53 of filter 500 of FIG. 5. An error signal e(k), generated by combiner 67 as the difference between output signal y(k) and desired signal d(k), is then applied to all of multipliers 64. Multipliers 64 act in conjunction with combiners 63 essentially as polarity controls on multipliers 52'. Combiners 63, which each have a feedback connection between an output and the second input thereof, are coupled to an input of multipliers 52' and thus are effectively toggled or ratcheted up and down. The weighting factors in multipliers 52' thus are either incremented positively, decremented negatively, or left unchanged at each clock cycle.

The mean-square error is a quadratic function in terms of the weighting factors ($w_i$) and can be represented as a parabola or paraboloid, depending on the number of weighting factors involved, so that there is only one global minimum. The goal of the mean-square algorithm is to reach this minimum in some manner. When this minimum is reached, the algorithm is said to have converged. The gradient method is used to find an optimum set of weights or a weight vector. From any beginning weight vector the next weight vector is chosen to be equal to the previous weight vector plus an increment proportional to the negative of the slope of the mean-square error at the previous weight vector. The adaptation equation can be represented as:

$$W_{k+1}(i) = W_k(i) + 2\text{mu} \; e(k) \; X_k(k-i), \qquad (2)$$

where $W_k(i)$ = the previous vector, $W_{k+1}(i)$ = the next vector, e(k) = the error difference, $X_k(k-i)$ = the present signal sample at the ith tap, 2mu = the optional gain factor, k = the time index, and i = the spatial tap index.

Multi-input adder 53' is generally difficult to implement in silicon because it is complex, typically comprising a plurality of paired adders serially coupled, has a relatively slow response time because of the plurality of serial add operations required in its implementation, and is not easily expandable. Accordingly, the adaptive filter of FIG. 6 suffers from the limitations associated with multi-input adder 53'.

U.S. Pat. No. 3,414,819 (R. W. Lucky), issued Dec. 3, 1968, describes a "Digital Adaptive Equalizer System" which effectively uses a filter having a delay line and a multiple input adder denoted as summer 16. Summer 16 suffers essentially the same limitations as multi-input adder of FIG. 6 herein.

It is desirable to provide an nth-order digital filter and an nth-order adaptive digital filter which can be implemented in silicon, have relatively fast response times and are relatively simple to expand.

SUMMARY OF THE INVENTION

The present invention is directed to the implementation of the Least Mean Square (LMS) adaptive filtering algorithm by a digital filter which is implemented in silicon as a Very Large Scale Integrated (VLSI) Circuit. A full eighth-order LMS filter is effected in parallel such that the entire filter operation is accomplished during a single clock period.

The conventional adaptive filter on which the LMS algorithm, sometimes known as the stochastic gradient algorithm, is practiced comprises a tapped delay line from which multiple samples of a signal being processed are derived, a plurality of weighting coefficients are applied to each sample, and finally the sum of the weighted signals is taken as the processed output signal. I have discovered that the relatively complex and slow responding multi-input adder circuit can be eliminated by transposing the input and output signals in such a way that the weighting coefficients derived from past samples of the input signals are applied in inverse order to past samples of the output signals. Thus, no adder or multiplier needs to combine more than two signals at a time and all additions and multiplications can take place in a single sampling period. Due to this simplification, a circuit, which is controlled by a megaHertz rate clock, implements the LMS algorithm and itself can be formed on a single silicon chip using a variety of semiconductor technologies including Complementary Metal Oxide Silicon (CMOS) technology. Such chips are modularized, and are therefore susceptible to being cascaded.

In one embodiment the digital filter comprises first and second delay lines, a plurality of first multipliers, a plurality of second multipliers and a plurality of accumulators. The first delay line is formed of first delay units connected in series and the second delay line is formed of alternating second delay units and adders. A first input of each of the first multipliers is connected to an output of a separate one of the first delay units. An output of each of the second multipliers is connected to a second input of a separate adder. A first input of each accumulator is coupled to an output of a separate one of the first multipliers and an output and the second input of each accumulator is coupled to a first input of a separate one of the second multipliers. An input of the filter is coupled to the first delay unit of the first delay line and to a second input of each of the second multipliers. An output of the filter is coupled to an output of the last second delay unit of the second delay line.

BRIEF DESCRIPTION OF THE DRAWING

This invention will be better understood from the following more detailed description taken in connection with the accompanying drawing in which:

FIG. 9 shows a block schematic diagram of a system identification or echo cancellation arrangement employing two modular adaptive digital filters in cascade according to this invention.

DETAILED DESCRIPTION

Figure 6:
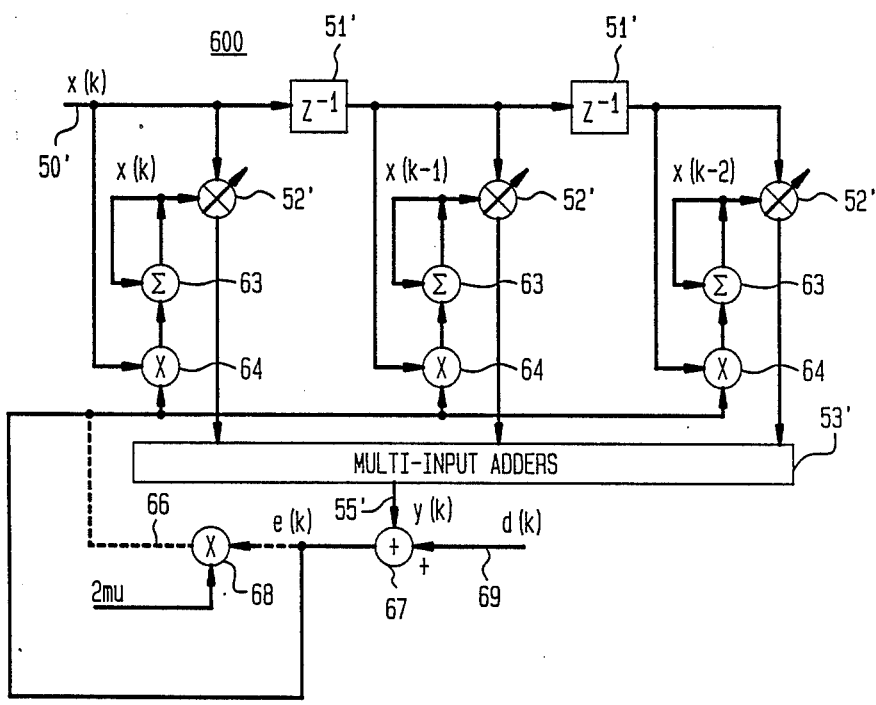
FIG. 6 shows a block schematic diagram of an adaptive digital filter useful in signal equalization.
Figure 7:
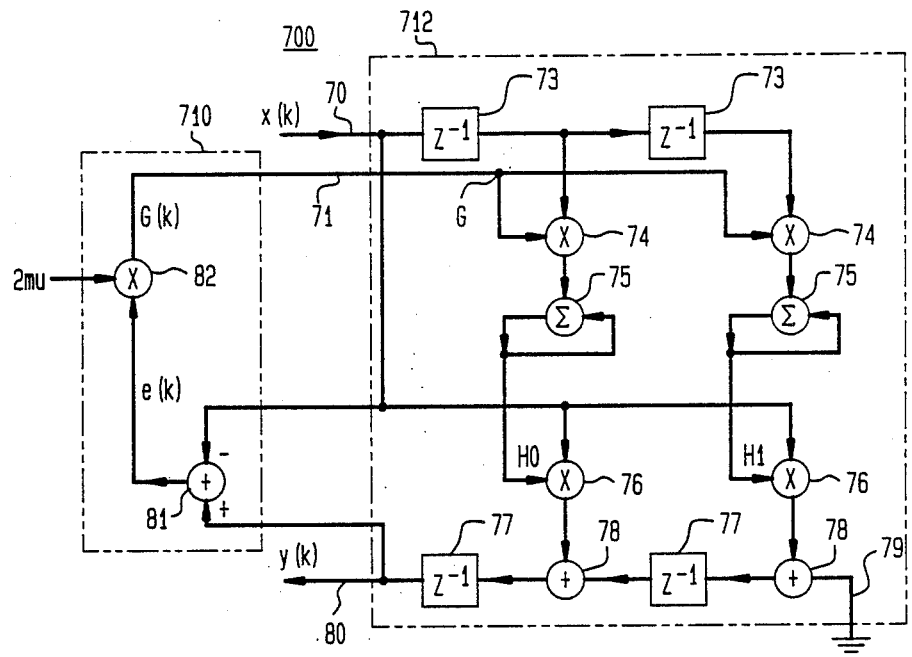
FIG. 7 shows a block schematic diagram of an adaptive filter in accordance with the invention.

Referring now to FIG. 7, there is shown an adaptive filter 700 of the third order in accordance with one embodiment of the invention. Adaptive filter 700 comprises in a first dashed rectangle error control apparatus 710 and comprises in a second dashed rectangle a filter 712. Adaptive filter 700, which does not, use a multi-input adder like multi-input adder 53' of FIG. 6, performs the basic function of the adaptive filter of FIG. 6, is capable of higher speed operation since it is able to do a full evaluation of all weighting factors within a single clock cycle, can be modularized and can be implemented in silicon as a VLSI circuit.

Filter 712 comprises a first delay line comprising a series combination of delay units 73 (shown as rectangles with a $z^{-1}$ therein), each having an input and an output, two multipliers 74 (shown as circles with a times (X) sign therein), each having first and second inputs and an output, two multipliers 76 (shown as circles with a times (X) sign therein), each having first and second inputs and an output, two accumulators 75 (shown as circles with a sigma ($\Sigma$) sign therein), each having first and second inputs and an output with individual feedback paths there around coupling the output to the first input thereof, a series combination of delay units 77 (shown as rectangles with a $z^{31\,1}$ therein), and adders 78 (shown as circles with a plus (+) sign therein) having first and second inputs and an output. Each of multipliers 76 has a different multiplication factor which varies from H0 to H1. Accumulators 75 are essentially two input adders with memory which function such that the previous output is fed back to the first input thereof and added to the signal next applied to the second input thereof. The signal at the first input thereof is always the same as the previous output signal.

Error control apparatus 710 comprises a subtracter 81 (shown as a circle with a plus (+) sign therein) having a plus (+) input and a minus (−) input and an output, and a multiplier 82 (shown as a circle with a times (X) sign therein) having first and second inputs and an output. With respect to subtracter 81, a signal applied to the negative input is subtracted from a signal applied to the plus input and the result appears at the output. Multiplier 82, which is optional and can be eliminated in some applications, has an input coupled to 2 mu. This introduces a gain factor at the output of multiplier 82 such that a signal applied to the second input of multiplier 82 is multiplied by 2 mu and the result (shown as G(k) appears at the output of multiplier 82.

In adaptive filter 700, samples of an input signal x(k) at an input line 70 are coupled to the input of a first delay unit 73, to the minus input of subtracter 81, and to first inputs of each of multipliers 76. The output of the first delay unit 73 is connected to the input of the second delay unit 73 and to a first input of the first multiplier 74. The output of the second delay unit 73 is connected to the first input of the second multiplier 74.

In the second delay line a first adder 78 (shown on the rightmost side of FIG. 7) has a first input grounded through a line 79 and has the output thereof connected to the input of a delay unit 77. The output of this delay unit 77 is connected to a first input of the second adder 78. An output of the second adder 78 is coupled to the input of a second delay unit 77. The output of the second delay unit 77 is connected to a plus (+) input of the subtracter 81 and to an output line 80 on which an adaptive filter 700 output signal y(k) is generated. The second input of each of adders 78 is connected to an output of a separate multiplier 76. Each second input of a combiner 75 is coupled to an output of a separate multiplier 74. The output and a first input of each of accumulators 75 is coupled to a first input of a separate multiplier 76. The output of subtracter 81, at which an error signal e(k) is generated, is coupled through multiplier 82 and then through a line 71 to second inputs of multipliers 74. The output of multiplier 82 is shown as gain adjusted signal G(k) which is e(k) times 2 mu (the gain factor of multiplier 82).

In operation the adaptive filter 700 receives signal x(k) to be processed on input line 70. This signal is delayed in delay units 73 to form prior samples which are applied to individual input terminals of multipliers 74. The output signal of each of multipliers 74 is applied in turn to a second input of a separate accumulator 75. The output signals from accumulators 75 are applied to second inputs of individual multipliers 76, whose outputs in turn are combined in the second delay line including delay units 77 and adders 78 to form the present output signal y(k) on line 80. An input signal x(k) is combined in subtracter 81 with an output signal y(k) to form error signal e(k) which is given a gain factor by multiplier 82 and becomes G(k) on line 71, which is coupled to the respective second inputs of individual multipliers 74. The outputs of multipliers 74 provide correlation between the input signal x(k) with the output signal y(k) to accumulators 75. This successive correlated data is compared and effectively ratcheted in such a way as to effect an averaging function. The resultant averaged and correlated signals are next applied to inputs of multipliers 76, to which the present input sample x(k) is applied to second inputs thereof. Thus, updating signals, the outputs of accumulators 75, are first applied to multipliers 76 to create the present output signal y(k).

Figure 8:
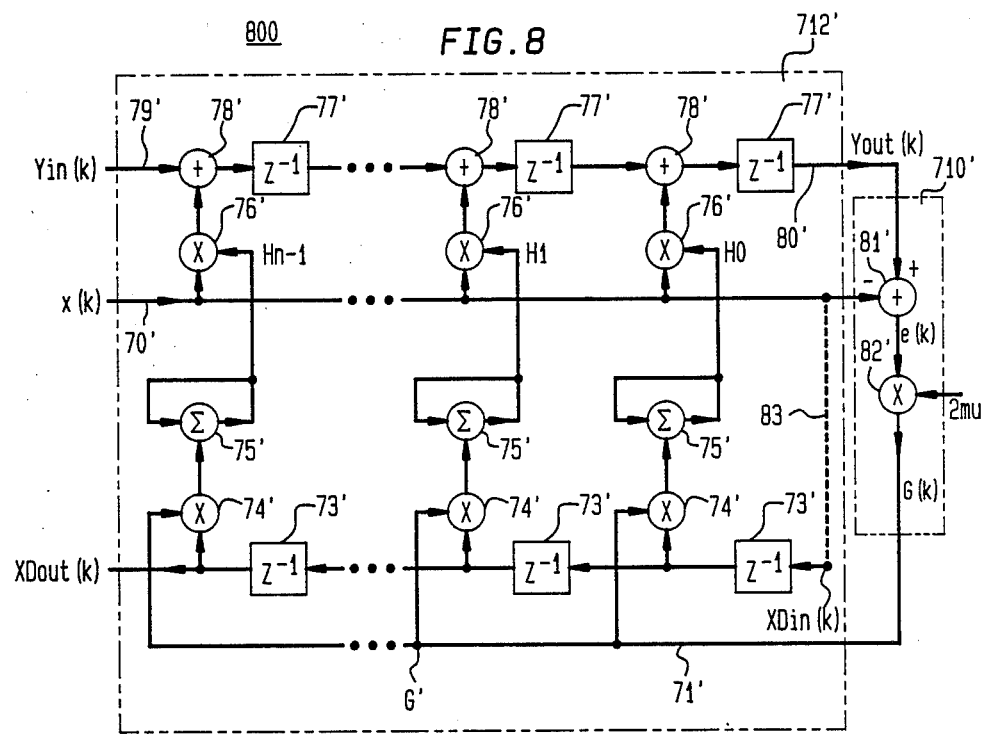
FIG. 8 shows a block schematic diagram of an nth order modular adaptive digital filter in accordance with the invention.

Referring now to FIG. 8, there is shown an adaptive filter 800 of the nth order in accordance with a preferred embodiment of the invention. Adaptive filter 800 comprises in a first dashed-line rectangle error-control apparatus 710' and comprises in a second dashed-line rectangle a filter 712'. Adaptive filter 800 is very similar to adaptive filter 700 shown in FIG. 7, except that it is of the nth order instead of the third order and that its components have been rotated 180 degrees up and then 180 degrees to the right. All components of adaptive filter 800 which are very similar to corresponding components of adaptive filter 700 of FIG. 7 have the same reference number with a prime (') added thereafter.

Filter 712' in this embodiment is of the nth-order, i.e., having (n−1) delay units 77' and (n−1) delay units 73' forming first and second delay lines, respectively, whereby a present sample and (n−1) delayed samples of an input signal are made available for processing. Each delay unit 73', 77' is in a block labeled $z^{-1}$ therein and is characterized by a unit delay ($z^{-1}$) equal to the reciprocal of an assumed clock rate of a high frequency of for example 10 megaHertz (MHz). Filter 712' further comprises adders 78' (three of which are shown as circular elements with a plus (+) sign therein); first and second pluralities of n multipliers 74' and n multipliers 76' (three of which are shown as circular elements with a times (X) sign therein); and n accumulators 75' (shown, as circular elements with a sigma (Σ) sign therein). Each of multipliers 76' has a different multiplication factor which varies from H0 to Hn−1 (only H0, H1 and Hn−1 are shown). The first delay line has a separate adder 78' positioned between adjacent delay units 77'.

Filter 712' is designed to be cascaded with like filters 712', as will be shown and described in connection with the apparatus shown in FIG. 9.

Error control apparatus 710' comprises a subtracter 81' (shown as a circle with a plus (+) sign therein) having a plus (+) input and a minus (−) input and an output and a multiplier 82' (shown as a circle with a times (X) sign therein) having first and second inputs and an output. With respect to subtracter 81', a signal applied to the negative input is subtracted from a signal applied to the plus input and the result (shown as gain adjusted error signal G(k)) appears at the output. Multiplier 82', which is optional and can be eliminated in some applications, has an input coupled to 2 mu. This introduces a gain factor at the output of multiplier 82' such that a signal applied to the second input of multiplier 82' is multiplied by 2 mu and the result appears at the output of multiplier 82'.

An input line 79' has a Yin(k) signal which comes from another filter 712'. In filter 712 of FIG. 7, input line 79 is shown grounded, since no other filter is coupled thereto. An input line 70', to which input signal x(k) is applied, is coupled to a first input of each of multipliers 76' and to another stage of a filter 712', where another stage exists (not shown) to the right of the instant stage. If there is no such additional filter 712', then line 70' is coupled by way of a line 83 (shown dashed) to an input of the rightmost delay unit 73', which is here designated as XDin(k). An output of the leftmost delay unit 73' is coupled to a first input of a multiplier 74' and to an output designated as XDout(k). Gain-adjusted error signal G(k) is coupled to second inputs of each of multipliers 74'. G(k) is essentially the same as the error signal e(k) except that it is multiplied by the gain factor 2 mu of multiplier 82'.

In one preferred embodiment filter 712' is of the eighth order. On a top level of filter 712', which comprises delay units 77' and adders 78' in a series arrangement, at any given clock interval a sequence of output signal samples appear at delay elements 77', the most recent sample being located at input line 79' as yin(k).

The output of each multiplier 76' is coupled to a second input of a separate adder 78'. Where a single eighth-order filter only is in use, and where the particular filter is the highest order of two or more (i.e., the left most) cascaded filters 712', input line 79' is grounded. Otherwise, line 79' is connected to the next higher-ordered such filter. On a second level of filter 712', which comprises input line 70' and multipliers 76' (of which there are eight in an eighth-order filter with only three being shown), the present input signal x(k) is applied in common to a first input of each of multipliers 76' and by a dashed line 83 to an input (shown as XDin(k) of first delay unit 73'). On the next lower level of filter 712' there are located eight accumulators 75' with feedback paths between an input and an output thereof such that accumulators 75' provide averaging or ratcheting functions. The output of each combiner 75' is coupled to a second input of a separate multiplier 76'.

On the next lower level of filter 712' are located eight multipliers 74' (only three of which are shown) with the output of each being connected to an input of a separate one of the accumulators 75'. The lowest level of filter 712' comprises a series combination of delay units 73' which form the second delay line. The second delay line has stored in the delay units 73' thereof signal samples, herein denoted XDin(k), XDin(k−1), ... XDin(k−n). As described earlier herein, the right most delay unit 73' on this level of filter 712' is connected to the second level line 70', in the case of a single filter. If two filters 712' are cascaded together, then the input to the right most delay unit 73' is coupled to the XDout(k) of a second filter 712' as is shown in FIG. 9, which will be discussed later herein, or to a lower order filter otherwise. Previous samples of the input signal x(k) then appear at the left of the other delay units 73' on this level. Each of these samples is coupled to a first input of a separate one of multipliers 74'. On the lowest level of filter 712', which comprises line 71', an error signal G(k) is applied to a second input (shown as G) of each of multipliers 74'. The accumulated updating or weighting signals generated in the multipliers 74', accumulators 75', and multipliers 76' affect weighting factors H(i,k). It is clear that the arrangement of FIG. 8 implements the following equation:

$$Yout(k) = \sum_{i=0}^{m-1} H(i,k)X(k - i) + Yin(k); \text{ and}$$

where
Yout(k)=output signal at time (k),
H(i,k)=ith filter coefficient at time (k),
X(k)=input at time (k),
X(k−i)=input signal delayed by (i) clock cycles, and
Yin(k)=base input signal.

Equation (3) is a modified form of equation (1) by the addition of Yin(k). The following equation (4) represents the updating equation for the implementation of the LMS algorithm. Thus, $$H(i,k+1) = H(i,k) + G(k) X(k-i) \text{ for } i=0,\ldots,7 \quad (4)$$

where the parameters are as previously defined, and G(k)=estimated error gradient at time (k).

Estimate G(k) may contain a gain factor (2 mu), if desired.

The (mu) factor, where included in the G(k) factor, allows the user to specify a desired adaptation constant or gain factor (depending on whether or not convergence is near or remote) and also to perform other processing during adaptation, such as changing (mu) on the fly (gear-shifting) or performing averaging on the error term prior to its use as a gradient estimate.

Equations (3) and (4) completely describe the LMS adaptive filtering algorithm for an eighth-order adaptive filter according to this invention. The implementing VLSI circuit for equations (3) and (4) contains sixteen eight-bit parallel array multipliers 74' and 76', eight sixteen-bit accumulators 75', eight sixteen-bit adders 78', and sixteen delay elements 73' and 77'. Not shown in FIG. 8 are eight-bit registers external to the integrated-circuit chip for storing and preloading initial coefficient sets.

Figure 2:
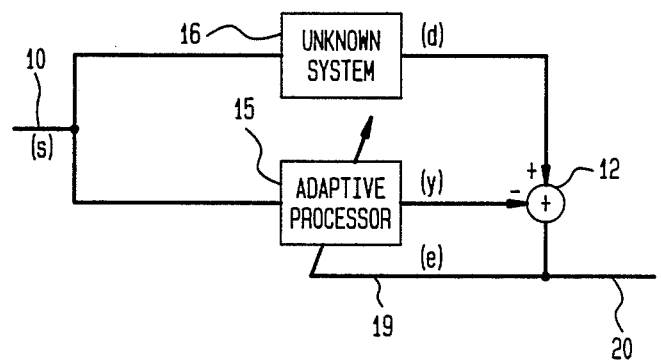
FIG. 2 shows a block schematic diagram of a known application of an adaptive processor to a system identification arrangement.

Referring now to FIG. 9, there is shown in a dashed-line box a system 900 which performs the function of the system shown in FIG. 2 and is in accordance with the invention. System 900 is an adaptive filter which comprises two filters 712', each being identical to filter 712' of FIG. 8, and error control apparatus 710' comprising a subtracter 81' and a multiplier 82' which are identical to the corresponding components of control apparatus 710' of FIG. 8. The two filters 710' and error control apparatus 712' are coupled to an unknown system 100.

An input signal x(k) is coupled to an input of the unknown system 100, to each of the x(k) inputs of cascaded filters 712', and to the XDin(k) inputs of the second filter 712' by way of line 70'. An output d(k) of the unknown system 100 is coupled to a first positive input of subtracter 81'. Output Yout(k) of the second filter 712' is coupled to a second negative input of subtracter 81' by way of line 106. An error-signal output e(k) of subtracter 81' is coupled to an input of multiplier 82' by way of line 107. A second input of multiplier 82' is coupled to a source of gain control, which has a value of 2 mu, by way of lead 108. A combined error output signal G(k) of multiplier 82' is further coupled via line 71' to each of the G inputs (the second inputs of multipliers 74' of 712' of FIG. 8) of filters 712' Yin(k) of the first filter 712' is typically coupled by way of line 79' to a reference source which is shown in FIG. 9 as ground potential. XDout(k) of the first filter 712' is left unconnected. Yout(k) of the first filter 712' is coupled by way of line 103 to Yin(k) of the second filter 712'. XDout(k) of the second filter 712' is coupled by way of line 104 to XDin(k) of the first filter.

It is to be noted that input line signals and coefficients are in eight-bit, two's complement format, while the cascaded output signals are in twelve-bit two's complement format. Internally, all arithmetic operations are performed at full sixteen-bit precision and are truncated only at the output to twelve-bit format because of a current 68-pin count limitation. This, of course, is not a limitation on the principles of this invention.

Figure 1:
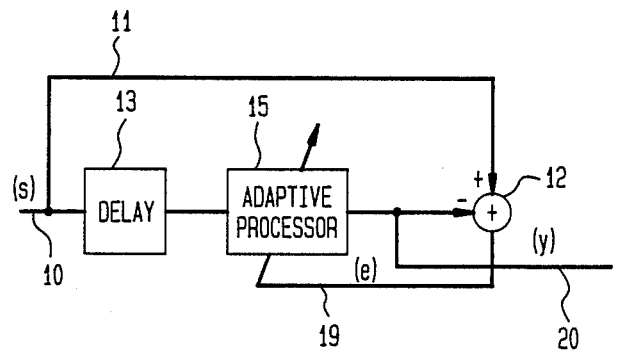
FIG. 1 shows a block schematic diagram of a known application of an adaptive processor to a linear prediction arrangement.
Figure 3:
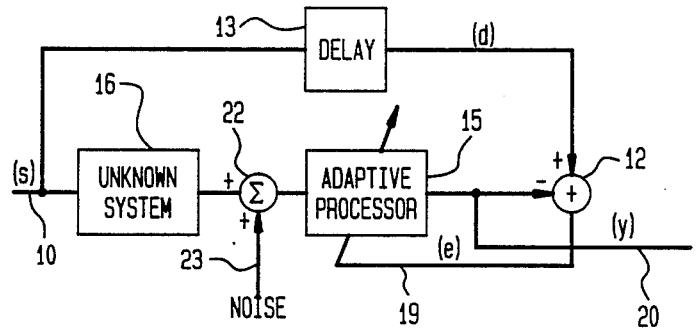
FIG. 3 shows a block schematic diagram of a known application of an adaptive processor to a transmission channel equalization arrangement.
Figure 4:
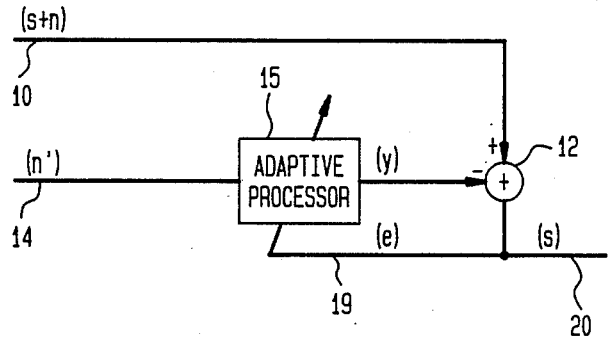
FIG. 4 shows a block schematic diagram of a known application of an adaptive processor to an interference cancellation arrangement.
Figure 5:
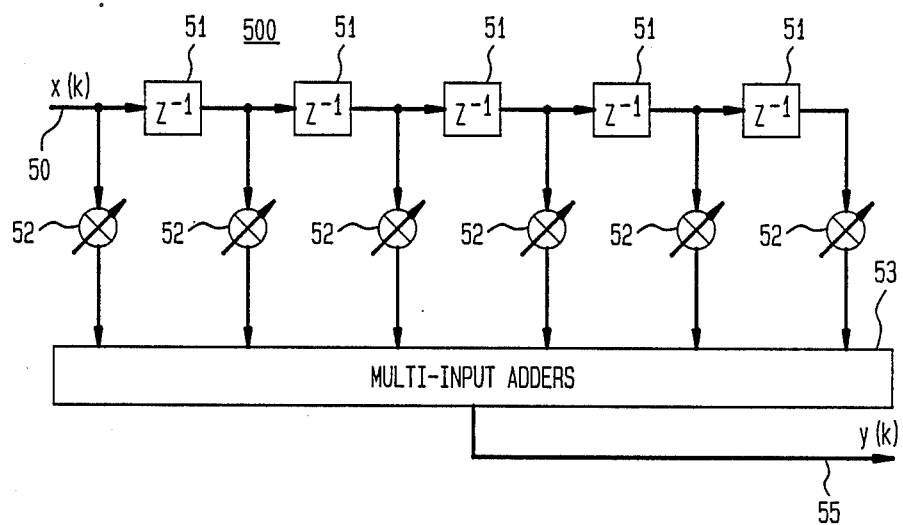
FIG. 5 shows a block schematic diagram of a finite-impulse-response digital filter.

While FIG. 8 depicts a particular system identification application for this invention, it is to be understood that the modular adaptive filter described herein is merely illustrative of the spirit and scope of this invention and is equally applicable to the implementation of any of the adaptive processors shown in FIGS. 1, 3 and 4, as well as others not shown specifically.

What is claimed is:
1. A digital filter comprising:
a first delay line formed of one or more equal-period first delay units in series, each delay unit having an input and an output with the output of one delay unit of a pair of adjacent delay units being coupled to the input of the other of the pair, and the input of a first delay unit of the first delay line serving as a first input of the filter;

a second delay line formed of one or more equal-period second delay units in series, each second delay unit having an input and an output, the output of one second delay unit of a pair of adjacent second delay units being coupled to the input of the other of the pair and the output of a last delay unit of the second delay line serving as an output of the filter;

a plurality of adders, each adder having first and second inputs and an output, one of the adders having the first input serving as a second input of the filter and an output connected to an input of a first delay unit of said second delay line and the remaining adders each having a first input and the output coupled between an output and an input of respective pairs of adjacent delay units of said second delay line;

a plurality of first multipliers, each having a first input and an output, the first input of each of the first multipliers being connected to an output of a separate delay unit of the first delay line;

a plurality of second multipliers, each having first and second inputs and an output, the output of each of the second multipliers being connected to the second input of a separate one of said plurality of adders;

a plurality of accumulators, each having first and second inputs and an output, the first inputs of each accumulator being coupled to an output of a separate one of the first multipliers and an output and the second input of each accumulator being coupled to a first input of a separate one of the second multipliers; and the input of the first delay unit of the first delay line is coupled to a second input of each of the second multipliers.

2. The digital filter of claim 1 further comprising:

subtractor means for taking the difference between an input signal applied to the first input of the filter and an output signal generated at the output of the filter to generate an error signal at an output of the subtracter; and the output of the subtractor being coupled to a second input of each of the first multipliers.

3. The digital filter of claim 2 in cascade with one or more additional such filters from a lowest order input filter to one or more intermediate filters and to a highest-order filter in which:

an input of a first adder of the plurality of adders, which are coupled to the second delay line of the lowest-order filter, is grounded;

the output of the last delay unit of the second delay line of the lowest-order and each of any intermediate filters is connected to the first adder of the plurality of adders of a next higher-order filter, except for the output of the last delay unit of the second delay line of the highest-order filter which serves as the output of all cascaded filters;

the input of the first of the plurality of first delay units of the lowest-order and any intermediate-order filter is connected to the output of the last of the plurality of first delay units of a next higher-order filter, except that the output of the last of the plurality of the first delay units of the lowest-order filter is left unconnected;

the input signal is connected to the first of the first delay units of each filter; and the error signal from the subtractor means is connected to second inputs of each of the multipliers of the first plurality of multipliers of all cascaded filters.

4. The digital filter of claim 1 further comprising:

a delay element having an input and an output, the output of the delay element being coupled to the input of the filter, and the input of the delay element being an external signal source terminal;

each first multiplier having a second input; and subtracter, means, having a first input coupled to the output of the filter, a second input coupled to the input of the delay element, and an output thereof coupled to the second inputs of the first multipliers, for determining the difference between signals received from the external signal source and from the filter and for generating at the output thereof an error control signal.

5. The digital filter of claim 1 further comprising:

a system with unknown characteristics having an input coupled to a first input of the filter and an output;

wherein said plurality of first multipliers each having a second input in addition to said first input; and subtracter means, having a first input coupled to the output of the system, having a second input coupled to the output of the filter, and having an output thereof couple to the second inputs of the first multipliers, for determining the difference between signals received from the system and from the filter as an error control signal.

6. The digital filter of claim 1 further comprising:

a system with unknown characteristics having an input and an output;

a delay element having an input coupled to the input of the system and further having an output coupled to the first input of the filter;

wherein said plurality of first multipliers each having a second input in addition to said first input;

subtracter means, having a first input coupled to the output of the delay element, having a second input coupled to the output of the filter, and having an output coupled to the second inputs of the first multipliers, for determining the difference between signals received from the delay element and from the filter as an error signal; and the output of the filter being the desired output.

7. The digital filter of claim 1 further comprising:

the first input of the filter being coupled to a source of a signal which is essentially the inverse of a jamming portion of a combined signal which contains a desired portion;

wherein said plurality of first multipliers each having a second input in addition to said first input; and subtracter means, having a first input coupled to a source of the combined signal, a second input coupled to the output of the filter, and an output coupled to the second inputs of the first multipliers, for determining the difference between the combined signal and the signal received from the filter and for generating at the output thereof a signal which is essentially identical to the desired portion of the combined signal.

8. The digital filter of claim 1 wherein said digital filter is hereafter referred to as a first filter, and further comprising:
a second filter essentially identical to the first filter;
a system with unknown characteristics and having an input and an output;
the input of the system being coupled to first inputs of the first and second filters;
the output of the first filter being coupled to a second input of the second filter;
an output of the second filter being coupled to the last of the first delay units of the first filter; and
subtracter means, having a first input coupled to the output of the system, having a second input coupled to the first output of the second filter, and having an output thereof coupled to the first inputs of the first multipliers of the first and second filters, for determining the difference between signals received from the system and the second filter as an error signal.

9. The digital filter of claim 8 further comprising a gain-control element coupled between the output of the subtracter means and the inputs of the first and second filters.

10. A digital filter comprising:
first and second delay lines for providing equally spaced prior samples respectively of an input signal Xin(k) to be processed and a resultant output signal Yout(k);
adders within said second delay line interspersed between adjacent delay elements and preceding the first of such adjacent elements;
means for taking the difference between present samples of respective input signals Xin(k) and an output signal Yout(k) as an error signal G(k);
means for correlating the error signal G(k) from said difference-taking means with delayed samples of respective input signals for producing correlated values;
means for accumulating samples of delayed input signals from each correlated values of said correlating means to obtain average values thereof;
means for multiplying averaged and correlated values of delayed input signals from said accumulating means by the value of each input signal to form weighting coefficients; and
the multiplying means being coupled to inputs of the adders in the second delay line.

11. The digital filter of claim 10 in which:
the governing equation relating the output signal Yout(k) to the input signal Xin(k) is as follows:

$$Yout(k) = \sum_{i=0}^{m-1} H(i,k) X(k - i) + Yin(k),$$

where
Yout(k)=output signal at time (k),
H(i,k)=ith filter coefficient at time (k),
X(k)=input at time (k),
X(k−i)=input signal delayed by (i) clock cycles,
Yin(k)=carry-over signal, if any, from possible lower-order stages of a ground connection for a single-stage filter, and
m=order (number of delay units plus one) of the filter.

12. The digital filter of claim 10 in which:
the governing equation for weighting coefficient updating is as follows:

$$H(i,k) = H(i,k-i) + G(k)X(k-i) \text{ for } i=0, \ldots, M$$

where
H(i,k)=weighting coefficient for sample (i) at time (k),
H(i,k−i)=weighting coefficient for sample (i) at time (k−i),
G(k)=error component (including gain factor, if any) at time (k),
X(k−i)=input signal at time (k−i), and
M=order (number of delay units plus one) of the filter.

13. A digital filter comprising:
a first delay line formed of one or more equal-period first delay units in series, each delay unit having an input and an output with the output of one delay unit of a pair of adjacent delay units being coupled to the input of the other of the pair and the input of a first delay unit of the first delay line serving as a first input of the filter;
a second delay line formed of one or more equal-period second delay units in series, each second delay unit having an input and an output, the output of one second delay unit of a pair of adjacent second delay units being coupled to the input of the other of the pair and the output of a last delay unit of the second delay line serving as an output of the filter;
a plurality of adders, each adder having first and second inputs and an output, one of the adders having the first input serving as a second input of the filter and an output connected to an input of a first delay unit of said second delay line and the remaining adders each having a first input and the output coupled between an output and an input of respective pairs of adjacent delay units of said second delay line;
a plurality of first multipliers, each having a first and second inputs and an output, the first input of each of the first multipliers being connected to an output of a separate delay unit of the first delay line;
a plurality of second multipliers, each having first and second inputs and an output, the output of each of the second multipliers being connected to the second input of a separate one of said plurality of adders;
a plurality of accumulators, each having first and second inputs and an output, the first inputs of each accumulator being coupled to an output of a separate one of the first multipliers and an output and the second input of each accumulator being coupled to a first input of a separate one of the second multipliers; and
the input of the first delay unit of the first delay line is coupled to a second input of each of the second multipliers, and
subtracter means, having a first input coupled to the output of the filter, a second input coupled to the first input of the filter and to the second inputs of the second multipliers, and having an output thereof coupled to the second inputs of the first multipliers.

14. A digital filter comprising:
a first delay line formed of one or more equal-period first delay units in series, each delay unit having an input and an output with the output of one delay unit of a pair of adjacent delay units being coupled to the input of the other of the pair and the input of a first delay unit serving as a first input of the filter;

a second delay line formed of one or more equal-period second delay units in series, each second delay unit having an input and an output, the output of one second delay unit of a pair of adjacent second delay units being coupled to the input of the other of the pair and the output of a last delay unit of the second delay line serving as an output of the filter;

a plurality of adders, each adder having first and second inputs and an output, one of the adders having the first input serving as a second input of the filter and an output connected to an input of a first delay unit of said second delay line and the remaining adders each having a first input and the output coupled between an output and an input of respective pairs of adjacent delay units of said second delay line;

a plurality of first multipliers, each having a first and second inputs and an output, the first input of each of the first multipliers being connected to an output of a separate delay unit of the first delay line;

a plurality of second multipliers, each having first and second inputs and an output, the output of each of the second multipliers being connected to the second input of a separate one of said plurality of adders;

a plurality of accumulators, each having first and second inputs and an output, the first inputs of each accumulator being coupled to an output of a separate one of the first multipliers and an output and the second input of each accumulator being coupled to a first input of a separate one of the second multipliers;

the input of the first delay unit of the first delay line is coupled to a second input of each of the second multipliers;

a system with unknown characteristics having an input coupled to a first input of the filter and an output; and subtracter means, having a first input coupled to the output of the system, having a second input coupled to the output of the filter, and having an output thereof coupled to the second inputs of the first multipliers, for determining the difference between signals received from the system and from the filter as an error control signal.

15. A digital filter comprising:

a first delay line formed of one or more equal-period first delay units in series, each delay unit having an input and an output with the output of one delay unit of a pair of adjacent delay units being coupled to the input of the other of the pair, and the input of a first delay unit serving as a first input of the filter;

a second delay line formed of one or more equal-period second delay units in series, each second delay unit having an input and an output, the output of one second delay unit of a pair of adjacent second delay units being coupled to the input of the other pair and the output of a last delay unit of the second delay line serving as a output of the filter;

a plurality of adders, each adder having first and second inputs and an output, one of the adders having the first input serving as a second input of the filter and an output connected to an input of a first delay unit of said second delay line and the remaining adders each having a first input and the output coupled between an output and an input of respective pairs of adjacent delay units of said second delay line;

a plurality of first multipliers, each having a first input and an output, the first input of each of the first multipliers being connected to an output of a separate delay unit of the first delay line;

a plurality of second multipliers, each having first and second inputs and an output, the output of each of the second multipliers being connected to the second input of a separate one of said plurality of adders;

a plurality of accumulators, each having first and second inputs and an output, the first inputs of each accumulator being coupled to an output of a separate one of the first multipliers and an output and the second input of each accumulator being coupled to a first input of a separate one of the second multipliers;

the input of the first delay unit of the first delay line is coupled to a second input of each of the second multipliers;

a system with unknown characteristics having input and an output;

a delay element having an input coupled to the input of the system and further having an output coupled to the first input of the filter;

subtracter means, having a first input coupled to the output of the delay element, having a second input coupled to the output of the filter, and having an output coupled to the second inputs of the first multipliers, for determining the difference between signals received from the delay element and from the filter as an error signal; and the output of the filter being the desired output.

16. A digital filter arrangement comprising:

a first delay line formed of one or more equal-period first delay units in series, each delay unit having an input and an output with the output of one delay unit of a pair of adjacent delay units being coupled to the input of the other of the pair and the input of a first delay unit serving as a first input of the filter;

a second delay line formed of one or more equal-period second delay units in series, each second delay unit having an input and an output, the output of one second delay unit of a pair of adjacent second delay units being coupled to the input of the other pair and the output of a last delay unit of the second delay line serving as a output of the filter;

a plurality of adders, each adder having first and second inputs and an output, one of the adders having the first input serving as a second input of the filter and an output connected to an input of a first delay unit of said second delay line and the remaining adders each having a first input and the output coupled between an output and an input of respective pairs of adjacent delay units of said second delay line;

a plurality of first multipliers, each having first and second inputs and an output, the first input of each of the first multipliers being connected to an output of a separate delay unit of the first delay line;

a plurality of second multipliers, each having first and second inputs and an output, the output of each of the second multipliers being connected to the second input of a separate one of said plurality of adders;

a plurality of accumulators, each having first and second inputs and an output, the first inputs of each accumulator being coupled to an output of a separate one of the first multipliers and an output and the second input of each accumulator being coupled to a first input of a separate one of the second multipliers;

the input of the first delay unit of the first delay line is coupled to a second input of each of the second multipliers;

the first input of the filter being coupled to a source of a signal which is essentially the inverse of a jamming portion of a combined signal which contains a desired portion; and subtracter means, having a first input coupled to a source of the combined signal, a second input coupled to the output of the filter, and an output coupled to the second inputs of the first multipliers, for determining the difference between the combined signal and the signal received from the filter and for generating at the output thereof a signal which is essentially identical to the desired portion of the combined signal.

17. A digital filter arrangement comprising:
a first filter including:
(a) a first delay line formed of one or more equal-period first delay units in series, each delay unit having an input and an output with the output of one delay unit of a pair of adjacent delay units being coupled to the input of the other of the pair and the input of a first delay unit serving as a first input of said first filter;
(b) a second delay line formed of one or more equal-period second delay units in series, each second delay unit having an input and an output, the output of one second delay unit of a pair of adjacent second delay units being coupled to the input of the other of the pair and the output of a last delay unit of the second delay line serving as an output of the filter;
(c) a plurality of adders, each adder having first and second inputs and an output, one of the adders having the first input serving as a second input of the filter and an output connected to an input of a first delay unit of said second delay line and the remaining adders each having a first input and the output coupled between an output and an input of respective pairs of adjacent delay units of said second delay line;
(d) a plurality of first multipliers, each having first and second inputs, and an output, the first input of each of the first multipliers being connected to an output of a separate delay unit of the first delay line;
(e) a plurality of second multipliers, each having first and second inputs and an output, the output of each of the second multipliers being connected to the second input of a separate one of said plurality of adders;
(f) a plurality of accumulators, each having first and second inputs and an output, the first input of each accumulator being coupled to an output of a separate one of the first multipliers and an output and the second input of each accumulator being coupled to a first input of a separate one of the second multipliers;

(g) the input of the first delay unit of the first delay line is coupled to a second input of each of the second multipliers;

a second filter essentially identical to said first filter;
a system with unknown characteristics and having an input and an output;
the input of the system being coupled to first inputs of the first and second filters;
the output of the first filter being coupled to a second input of the second filter;
an output of the second filter being coupled to a last delay unit of the first delay line of the first filter; and
subtracter means, having a first input coupled to the output of the system, having a second input coupled to the first output of the second filter, and having an output thereof coupled to the second inputs of the first multipliers of the first and second filters, for determining the difference between signals received from the system and the second filter as an error signal.

18. The digital filter arrangement of claim 17 further comprising a gain-control element coupled between the output of the subtracter means and the second inputs of the first multipliers of the first and second filters.

19. A digital filter comprising:
a first delay line comprising a plurality of first delay units serially coupled together;
an input of the filter being coupled to an input of the first delay unit of the first delay line;
a second delay line comprising a plurality of second delay units with adders interspersed between adjacent second delay units and further comprising an additional adder having an output coupled to an input of a first delay unit of the second delay line;
an output of a last delay unit of the second delay line being coupled to an output of the filter;
means for taking the difference between signals applied to the input of the first delay line and signals appearing at the output of the second delay line as an error difference signal;
first means, having a separate one of a plurality of first inputs coupled to a separate one of the outputs of the first delay units, and having a plurality of second inputs coupled to the error difference signal from the difference-taking means for correlating the error difference signal with delayed samples of each input signal;
second means having a first input coupled to the output of the first means for accumulating correlated samples of delayed input signals therefrom to obtain average values thereof;
third means, having first inputs coupled to the input of the filter and having second inputs with a separate one of each being coupled to separate outputs of the second means, for multiplying averaged correlated values of delayed input signals by the value of present input signal to form weighting coefficients; and
the third means having a separate output being coupled to second inputs of a separate one of the adders in the second delay line.

20. A digital filter comprising:
a first delay line formed of a plurality of one or more equal-period first delay units in series, each delay unit having an input and an output with the output of one delay unit being coupled to the input of a next delay unit of the first delay line and the input of a first delay unit serving as a first input of the filter;

a second delay line formed of a plurality of one or more equal-period second delay units in series with a separate one of a plurality of two-input and one-output adders separating adjacent second delay units;

an output of one second delay unit being coupled to a first input of a separate adder with the output of that adder being coupled to an input of a next second delay unit;

the output of a last delay unit of the second delay line serving as an output of the filter;

one of the plurality of adders having a first input serving as a second input of the filter and having an output coupled to an input of a first delay unit of the second delay line;

a plurality of first multipliers, each having first and second inputs and an output, a first input of each of the first multipliers being connected to an output of a separate delay unit of the first delay line;

a plurality of second multipliers, each having first and second inputs and an output, the output of each of the second multipliers being connected to the second input of a separate one of said plurality of adders;

a plurality of accumulators, each having first and second inputs and an output, the first inputs of each accumulator being coupled to an output of a separate one of the first multipliers, and an output and the second input of each accumulator being coupled to a first input of a separate one of the second multipliers; and the input of a first delay unit of the first delay line is coupled to a second input of each of the second multipliers.

21. A digital filter comprising:

a first delay line formed of a plurality of one or more equal-period first delay units in series, each delay unit having an input and an output with the output of one delay unit being coupled to the input of a next delay unit of the first delay line and the input of a first delay unit serving as a first input of the filter;

a second delay line formed of a plurality of one or more equal-period second delay units in series with a separate one of a plurality of two-input and one-output adders separating adjacent second delay units;

an output of one second delay unit being coupled to a first input of a separate adder with the output of that adder being coupled to an input of a next second delay unit;

the output of a last delay unit of the second delay line serving as an output of the filter;

one of the plurality of adders having a first input serving as a second input of the filter and having an output coupled to an input of a first of the second delay units;

a plurality of first multipliers, each having first and second inputs and an output, a first input of each of the first multipliers being connected to an output of a separate delay unit of the first delay line;

a plurality of second multipliers, each having first and second inputs and an output, the output of each of the second multipliers being connected to the second input of a separate one of said plurality of adders;

a plurality of accumulators, each having first and second inputs and an output, the first inputs of each accumulator being coupled to an output of a separate one of the first multipliers, and an output and the second input of each accumulator being coupled to a first input of a separate one of the second multipliers; and subtracter means, having a first input coupled to the output of the filter, a second input coupled to the first input of the filter and to the second input of each of the second multipliers, and having an output thereof coupled to the second inputs of the first multipliers.

22. An adaptive digital filter comprising:

a first stage comprising:

first and second equal-period delay units, each having an input and an output, the input of said first delay unit of the first stage and the output of said second delay unit of the first stage serving respectively as the input and the output of the filter;

an adder having first and second inputs and an output with the output being coupled to the input of said second delay unit;

a first multiplier having a first input coupled to the output of said first delay unit, a second input and an output;

an accumulator having a first input coupled to the output of said first multiplier, and a second input and an output coupled to each other;

a second multiplier having a first input coupled to the input of said first delay unit, a second input coupled to the output of said accumulator and an output coupled to the first input of said adder;

the second input of the adder being coupled to a reference level when the filter comprises only the first stage and being coupled to another essentially identical stage if the filter comprises an additional stage; and the adaptive digital filter further comprising a subtracter having first and second inputs coupled respectively to the input of the first delay unit of the first stage and to the output of the second delay unit of the first stage and having an output coupled to the second input of the first multiplier of the first stage.

23. The adaptive digital filter of claim 22 further comprising:

a second stage which is essentially identical to the first stage;

the input of the first delay unit of the second stage being coupled to the output of the first delay unit of the first stage;

the output of the second delay unit of the second stage being coupled to the second input of the adder of the first stage;

the second input of the first multiplier of the second stage being coupled to the second input of the first multiplier of the first stage; and the first input of the second multiplier of the second stage being coupled to the first input of the second multiplier of the second stage.

24. The adaptive digital filter of claim 23 further comprising:

n additional stages with each additional stage being essentially identical to the second stage;

the first of the n additional stages being coupled to the second stage in essentially the same manner that the second stage is coupled to the first stage; and the second through nth stages of the n additional stages each being coupled to a preceding stage in essentially the same manner that the second stage is coupled to the first stage.

25. A digital filter comprising:
a first delay line formed of a plurality of one or more equal-period first delay units in series, each delay unit having an input and an output with the output of one delay unit being coupled to the input of the next of the first delay units;
a plurality of equal-period second delay units each having an input and an output;
a plurality of adders each having at least two inputs and an output;
a second delay line formed of the second delay units with a separate one of the adders being coupled by a first input thereof to an output of a second delay unit and being coupled by an output thereof to an input of a succeeding second delay unit and with the first of the second delay units having the input thereof coupled to the output of a separate one of the adders;
a plurality of first multipliers, each having first and second inputs and an output, a first input of each of the first multipliers being connected to an output of a separate delay unit of the first delay line;
a plurality of second multipliers, each having first and second inputs and an output, the output of each of the second multipliers being connected to the second input of a separate one of said plurality of adders; and
a plurality of accumulators, each having first and second inputs and an output, the first input of each accumulator being coupled to an output of a separate one of the first multipliers, and an output and the second input of each accumulator being coupled to a first input of a separate one of the second multipliers.

* * * * *